United States Patent
Shukh et al.

(10) Patent No.: US 8,681,535 B2
(45) Date of Patent: Mar. 25, 2014

(54) NONVOLATILE LATCH CIRCUIT

(76) Inventors: Alexander Mikhailovich Shukh, Savage, MN (US); Tom A. Agan, Maple Grove, MN (US)

(*) Notice: Subject to any disclaimer, the term of this patent is extended or adjusted under 35 U.S.C. 154(b) by 0 days.

(21) Appl. No.: 13/475,332

(22) Filed: May 18, 2012

(65) Prior Publication Data
US 2012/0307549 A1 Dec. 6, 2012

Related U.S. Application Data

(60) Provisional application No. 61/493,405, filed on Jun. 3, 2011.

(51) Int. Cl.
*G11C 11/41* (2006.01)

(52) U.S. Cl.
USPC ........... 365/154; 365/148; 365/158; 365/163; 365/185.08

(58) Field of Classification Search
USPC ..................................... 365/185.08
See application file for complete search history.

(56) References Cited

U.S. PATENT DOCUMENTS

| | | | |
|---|---|---|---|
| 6,147,900 A | 11/2000 | Pohm | |
| 6,175,525 B1 | 1/2001 | Fulkerson et al. | |
| 6,317,359 B1 | 11/2001 | Black et al. | |
| 6,343,032 B1 | 1/2002 | Black et al. | |
| 6,985,382 B2 | 1/2006 | Fulkerson et al. | |
| 7,082,053 B1 | 7/2006 | Jenne et al. | |
| 7,663,197 B2 | 2/2010 | Nagase et al. | |
| 7,733,145 B2 | 6/2010 | Abe et al. | |
| 7,755,930 B2 | 7/2010 | Kim et al. | |
| 7,961,502 B2 | 6/2011 | Chua-Eoan | |
| 8,040,154 B2 | 10/2011 | Chua-Eoan et al. | |
| 8,174,872 B2 | 5/2012 | Sakimura et al. | |
| 8,295,079 B2 * | 10/2012 | Yamamoto et al. ........... 365/154 |
| 2012/0105105 A1 | 5/2012 | Shukh | |

FOREIGN PATENT DOCUMENTS

JP   WO2009/028298   *   3/2009

OTHER PUBLICATIONS

S.-M. Kang, Y. Leblebici, CMOS Digital Integrated Circuits: Analysis and Design, 3rd edition, McGraw-Hill, New York, 2003 (655 pages).
N.H.E. Weste, D.M. Harris, CMOS VLSI Design: A Circuits and Systems Perspective, 4th edition, Addison-Wesley, Boston, 2011 (838 pages).

* cited by examiner

Primary Examiner — Tan T. Nguyen

(57) ABSTRACT

A nonvolatile latch circuit that includes a logic circuitry comprising at least an input terminal, a clock terminal, an output terminal, and a nonvolatile memory element. The logic circuitry is electrically coupled to a high voltage source at a first source terminal and to a low voltage source at a second source terminal. The nonvolatile memory element is electrically coupled to the output terminal at a first end and to an intermediate voltage source at a second end. A logic state of the latch circuit responds to an input signal during an active period of a clock signal. A logic state of the nonvolatile memory element is controlled by a bidirectional current running between the first and second ends. An electrical potential of the intermediate voltage source is higher than that of the low voltage source but lower than that of the high voltage source.

20 Claims, 14 Drawing Sheets

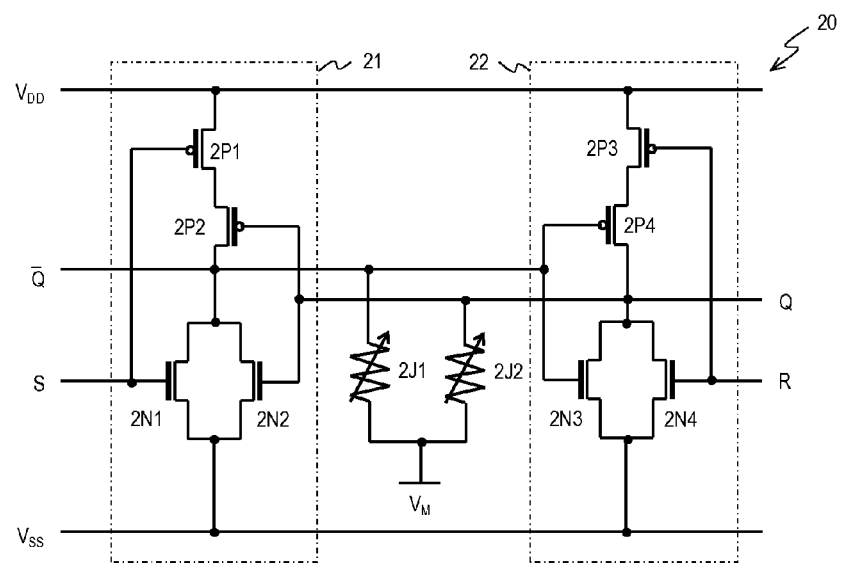
Fig. 2A
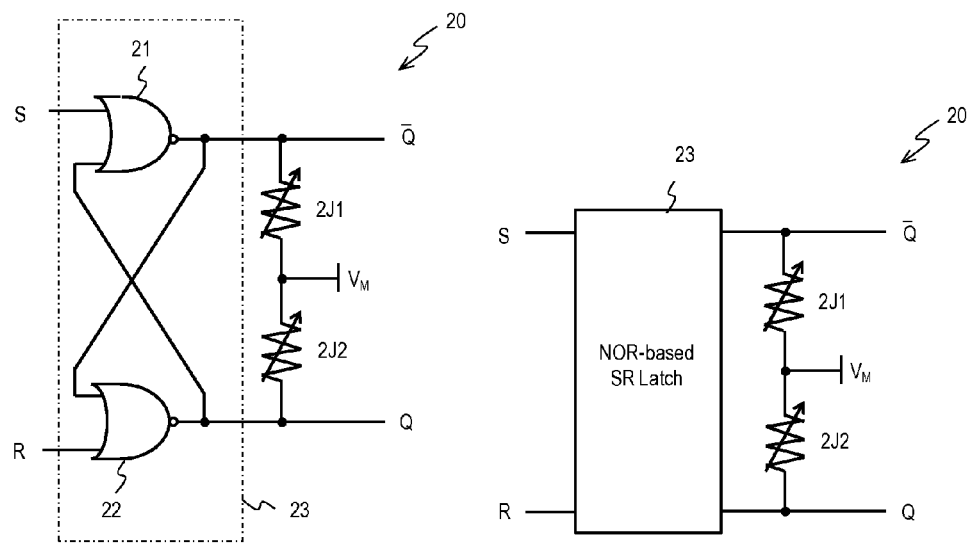
Fig. 2B
Fig. 2C

NONVOLATILE LATCH CIRCUIT

CROSS-REFERENCE TO RELATED APPLICATIONS

This application claims the benefit of provisional patent application No. 61/493,405, filed on Jun. 3, 2011 by the present inventors.

FEDERALLY SPONSORED RESEARCH

Not Applicable

SEQUENCE LISTING OR PROGRAM

Not Applicable

RELEVANT PRIOR ART

U.S. Pat. No. 7,733,145, Jun. 8, 2010—Abe et al.
U.S. Pat. No. 7,961,502, Jun. 14, 2011—Chua-Eoan
U.S. Pat. No. 8,174,872, May 8, 2012—Sakimura et al.
U.S. Patent Application Publication No. US 2012/0105105, May 3, 2012—Shukh Kang et al., CMOS Digital Integrated Circuits, McGraw-Hill Companies, Inc., $3^{rd}$ edition, 2003.

BACKGROUND

A latch is a fundamental digital logic circuit of numerous logic devices such as microcontrollers, processors, field programmable gate arrays (FPGAs) and many others. In general, the latch is an electronic circuit that has two stable states and therefore can store one bit of information. Its output depends on both current and previous inputs. Such a circuit is described as a sequential logic. There are several designs of latch circuits such as SR-latch, JK-latch, D-latch, T-latch, etc. These circuits are mostly built using a complimentary metal-oxide-semiconductor (CMOS) technology employing complementary and symmetrical pairs of p-type and n-type of metal-oxide-semiconductor field effect transistors (MOSFETs) for logic functions. A CMOS inverter is one of key elements of the latches. The conventional CMOS inverter is volatile.

FIG. 1 shows a nonvolatile CMOS inverter 10 according to a prior art. The inverter 10 includes an p-type MOS (pMOS) transistor 1P1, an n-type MOS (nMOS) transistor 1N1, and a nonvolatile magnetoresitive (MR) memory element (or magnetic tunnel junction (MTJ)) 1J1. Gates of the pMOS transistor 1P1 and the nMOS transistor 1N1 are connected in common to serve as an input terminal IN. Drains of the transistors 1P1 and 1N1 also connected in common serve as an output terminal OUT. Sources of the pMOS transistor 1P1 and the nMOS transistor 1N1 are connected to voltage sources $V_{DD}$ and $V_{SS}$, respectively. The nonvolatile memory element 1J1 is connected to the output terminal OUT of the inverter 10 at its first end and to a memory (intermediate) voltage source $V_M$ at its second end, where $V_{DD} > V_M > V_{SS}$. The source terminal of the nMOS transistor 1N1 can be connected to a grounding source GRD ($V_{DD} > V_M >$ GRD). Moreover, the MTJ element 1J1 can also be connected to the grounding source GRD. In this case the following relation between electric potentials of the voltage sources can be observed: $V_{DD} >$ GRD $> V_{SS}$.

The MR element 1J1 can comprise at least a free (or storage) layer 12 with a reversible magnetization direction (shown by a dashed arrow), a pinned (or reference) layer 14 with a fixed magnetization direction (shown by a solid arrow), and a nonmagnetic insulating tunnel barrier layer 16 sandwiched in-between. Resistance of the memory element 1J1 depends on a mutual orientation of the magnetization directions in the free 12 and pinned 14 layers. The resistance has a highest value (logic "1") when the magnetization directions are antiparallel to each other, and the lowest value (logic "0") when they are parallel. Hence the magnetization direction of the free layer 12 can have two stable logic states. It can be controlled by a direction of a spin-polarized current $I_S$ running through the element 1J1 in a direction perpendicular to layers surface (or plane). The direction of the current $I_S$ and hence the magnetization direction of the free layer 12 depends of the polarity of the input signal at the gates of the transistors 1P1 and 1N1.

When an input signal IN=1 (logic "1") is applied to the common gate terminal of the transistors 1P1 and 1N1, the pMOS transistor 1P1 is "Off" and the nMOS transistor 1N1 is "On". The spin-polarized current $I_S$ is running in the direction from the memory source $V_M$ to the source $V_{SS}$. The current $I_S$ of this direction can force the magnetization direction of the free layer 12 in parallel to the magnetization direction of the pinned layer 14, which corresponds to a logic "0". When the input signal is changed to IN=0 (a logic "0"), the pMOS transistor 1P1 turns "On" but the nMOS transistor 1N1 is "Off". The spin-polarizing current $I_S$ is running in the opposite direction from the logic source $V_{DD}$ to the memory source $V_M$. As a result, the magnetization direction of the free layer 12 can be forced in antiparallel to the magnetization direction of the pinned layer 14. This mutual orientation of the magnetizations corresponds to a high resistance state or to logic "1". Hence, the logic value of the memory element 1J1 corresponds to a logic value at the output terminal of the conventional volatile CMOS inverter. The memory element 1J1 can provide a nonvolatile storage of the logic state of the inverter 10. The data may not be lost when the power is off.

CMOS-based latches are volatile. They can lose their data when the power is off. The present disclosure addresses to this problem.

SUMMARY

Disclosed herein is a nonvolatile latch circuit that includes at least a first logic gate electrically coupled to a high voltage source at a first source terminal and to a low voltage source at a second source terminal, a second logic gate electrically coupled to the high voltage source at a first source terminal and to the low voltage source at a second source terminal, the first and second logic gates are electrically cross-coupled to each other, and a first nonvolatile memory element electrically coupled to an output terminal of the first logic gate at a first end and to an intermediate voltage source at a second end, wherein a logic state of the nonvolatile memory element is controlled by a bidirectional current running between the first and second ends of the memory element, and wherein an electrical potential of the intermediate voltage source is higher than that of the low voltage source but lower than that of the high voltage source.

Also disclosed is a nonvolatile latch circuit that includes a logic circuitry comprising at least an input signal terminal, a clock signal terminal, and an output terminal, the logic circuitry is electrically coupled to a high voltage source at a first source terminal and to a low voltage source at a second source terminal, and a nonvolatile memory element electrically coupled to the output terminal at a first end and to a intermediate voltage source at a second end, wherein a logic state of the latch circuit responds to an input signal during an active period of a clock signal, wherein a logic state of the nonvolatile memory element is controlled by a bidirectional current running between the first and second ends of the memory element, and wherein an electrical potential of the intermediate voltage source is higher than that of the low voltage source but lower than that of the high voltage source.

BRIEF DESCRIPTION OF THE DRAWINGS

FIGS. 2A, 2B and 2C are a transistor-level, gate-level and block-level circuit diagrams, respectively, of a nonvolatile NOR-based SR-latch according to a first embodiment of the present disclosure.

DETAILED DESCRIPTION

Figure 1:
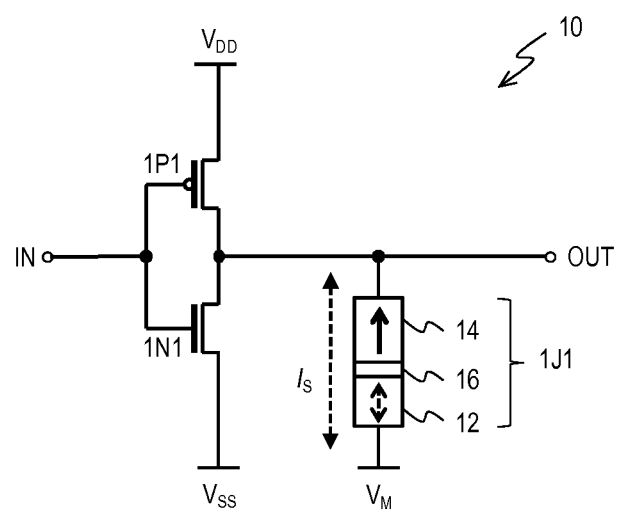
FIG. 1 is a transistor-level circuit diagram of a nonvolatile CMOS inverter according to a prior art.

Embodiments of the present disclosure will be explained below with reference to the accompanying drawings. Note that in the following explanation the same reference numerals denote constituent elements having almost the same functions and arrangements, and a repetitive explanation will be made only when necessary.

Note also that each embodiment to be presented below merely discloses an device for embodying the technical idea of the present disclosure. Numerical order of the embodiments can be any. Therefore, the technical idea of the present disclosure does not limit the materials, shapes, structures, arrangements, and the like of constituent parts to those described below. The technical idea of the present disclosure can be variously changed within the scope of the appended claims.

Refining now to the drawings, FIG. 1 illustrates a prior art. Specifically, the figure shows a magnetoresistive (MR) element (or magnetic tunnel junction (MTJ)) having a multilayer structure with ferromagnetic free and pinned layers having a perpendicular anisotropy. The MR element 1J1 shown in FIG. 1 for illustrative purpose comprises only the free 12 and pinned 14 magnetic layers separated by a tunnel barrier layer 16. Note that additional layers can also be included in the structure of the MR element 1J1. The ferromagnetic layers 12 and 14 may also have an in-plane direction of the magnetization without departing from a scope of the present disclosure. The direction of the magnetization in the magnetic layers 12 and 14 are shown by dashed or solid arrows. The MR element 1J1 can store binary data by using steady logic states determined by a mutual orientation of the magnetizations in the free 12 and pinned 14 ferromagnetic layers separated by a tunnel barrier layer 16. The logic state "0" or "1" of the MR element 1J1 can be changed by a spin-polarized current $I_S$ running through the element in the direction perpendicular to layers surface (or substrate).

The MR element herein mentioned in this specification and in the scope of claims is a general term of a tunneling magnetoresistance element using a nonmagnetic insulator or semiconductor as the tunnel barrier layer.

FIGS. 2A-2C show a transistor-level, gate-level and block-level circuit diagrams, respectively, of a nonvolatile NOR-based SR-latch 20 according to a first embodiment of the present disclosure. The SR-latch circuit 20 has two complementary outputs Q and $\overline{Q}$ (a complement of Q). By definition, the latch is said to be in its SET state when Q=1 (logic "1") and $\overline{Q}$=0 (logic "0"). Respectively, the SR-latch 20 is in its RESET state when Q=0 (logic "0") and $\overline{Q}$=1 (logic "1").

The transistor-level circuit of the SR-latch 20 is shown in FIG. 2A. It comprises two cross-coupled CMOS-based NOR gates 21 and 22. Each gate has two input terminals. Note that the number of inputs can be any. One input terminal of each NOR gate is coupled to an output terminal of the other gate. The other input terminal of the gate is using to enable switching of the latch 20.

For example, the 2-input NOR gate 21 comprises two pMOS transistors 2P1 and 2P2 connected in series and two nMOS transistors 2N1 and 2N2 connected in parallel to each other. Respectively, the 2-input NOR gate 22 comprises two pMOS transistors 2P3 and 2P4 connected in series to each other and two nMOS transistors 2N3 and 2N4 connected in parallel. The gate 21 further comprises an input terminal for applying a set input (S) and an output terminal $\overline{Q}$. Respectively, the NOR gate 22 comprises an input terminal for applying a reset input (R) and an output terminal Q. The output terminal $\overline{Q}$ of the NOR gate 21 is electrically coupled to the input terminal of the NOR gate 22 formed by gate terminals of the transistors 2P4 and 2N3. Respectively, the output terminal Q of the NOR gate 22 is electrically connected to the input terminal of the NOR gate 21 formed by the gate terminals of the transistors 2P2 and 2N2.

To provide a non-volatility to the SR-latch 20 two MR elements (or MTJs) 2J1 and 2J2 can be used. The MR element 2J1 is electrically coupled to the output terminal $\overline{Q}$ of the NOR gate 21 at its first end and to a memory (or intermediate) voltage source $V_M$ at its second end. The MR element 2J1 provides a nonvolatile storage of the logic state $\overline{Q}$. Respectively, the MR element 2J2 is electrically coupled to the output terminal Q of the NOR gate 22 at its first end and to the voltage source $V_M$ at its second end. The MR element 2J2 provides a nonvolatile storage of the logic state Q. Source terminals of pMOS transistors 2P1 and 2P3 are electrically coupled to a voltage source $V_{DD}$. Respectively, source terminals of the nMOS transistors 2N1-2N4 are electrically coupled to a voltage source $V_{SS}$, wherein $V_{DD}>V_M>V_{SS}$. Note that the source terminals of the nMOS transistors 2N1-2N4 can be coupled to a grounding source GRD ($V_{DD}>V_M>$GRD). The memory elements 2J1 and 2J2 of the SR-latch 22 can also be connected to the grounding source GRD ($V_{DD}>$GRD$>V_{SS}$).

If the set input S=1 (logic "1") and the reset input R=0 (logic "0"), the output terminal of the NOR gate 22 will be forced to Q=1 (logic "1") while the output terminal of the gate 21 is forced to $\overline{Q}$=0 (logic "0"). The SR-latch 20 can be set regardless of its previous logic state. In case when the inputs S=0 and R=1 the following combination of the output signals can be established: Q=0 and $\overline{Q}$=1. Hence, with this input combination the SR-latch 20 can be reset regardless of its previous logic state. When both S and R input signals are equal to S=R=0 (logic "0"), the SR-latch 20 cannot change (preserve) its previous logic state. The combination of S=R=1 is not permitted since in this case both outputs Q and $\overline{Q}$ can be forced to logic "0", which violates their complementarity. A truth table of the NOR-based SR-latch is given in Table 1.

TABLE 1

Truth Table of the NOR-based SR latch

| Input | | Output | | |
|---|---|---|---|---|
| S | R | $Q_{N+1}$ | $\overline{Q}_{N+1}$ | Operation |
| 0 | 0 | $Q_N$ | $\overline{Q}_N$ | Hold previous state |
| 1 | 0 | 1 | 0 | Set |
| 0 | 1 | 0 | 1 | Reset |
| 1 | 1 | 0 | 0 | Restricted combination |

When the following combination of the input signal (S=1 and R=0) is applied, the pMOS transistor 2P1 of the NOR-gate 21 is "Off" but the nMOS transistor 2N1 is "On", and $\overline{Q}$=0 (FIG. 2A). A spin-polarized current $I_S$ can occur in the MR element 2J1 running from the voltage source $V_M$ to the voltage source $V_{SS}$. This direction of the current $I_S$ in the MR element 2J1 having a structure of the MR element 1J1 (FIG. 1) can force the magnetization direction of the free layer 12 (dashed arrow "Up") in parallel to the magnetization direction (solid arrow "Up") of the pinned layer 14. The parallel mutual configuration of the magnetization directions in the free and pinned layers corresponds to a lowest resistance (logic "0"). Respectively, the input signal R=0 can force the pMOS transistor 2P3 of the gate 22 in "On" state but the nMOS transistor 2N4 can be "Off". The pMOS transistor 2P4 can be "On" as well due to $\overline{Q}$=0 applied to its gate terminal. A spin-polarized current $I_S$ can occur in the MR element 2J2 running in a direction from the source $V_{DD}$ to the source $V_M$ through pMOS transistors 2P3 and 2P4. This direction of the spin-polarized current $I_S$ can force the magnetization direction of the free layer of the MR element 2J2 (see the structure of the MR element 1J1 shown in FIG. 1) in antiparallel to the magnetization direction of the pinned layer. The antiparallel configuration of the magnetization directions in the free and pinned layers of the MR element 2J2 corresponds to a highest resistance value or to a logic "1". Hence, the MR elements 2J1 and 2J2 can store the logic value of the output terminals $\overline{Q}$ and Q, respectively.

During an operation, the MR elements are written each time there is a change of the logic state to the latch. This can occur without any additional intervention by the circuitry. The resistance of the MR elements will then reflect the final logic state of the latch when power is removed.

Figure 3A:
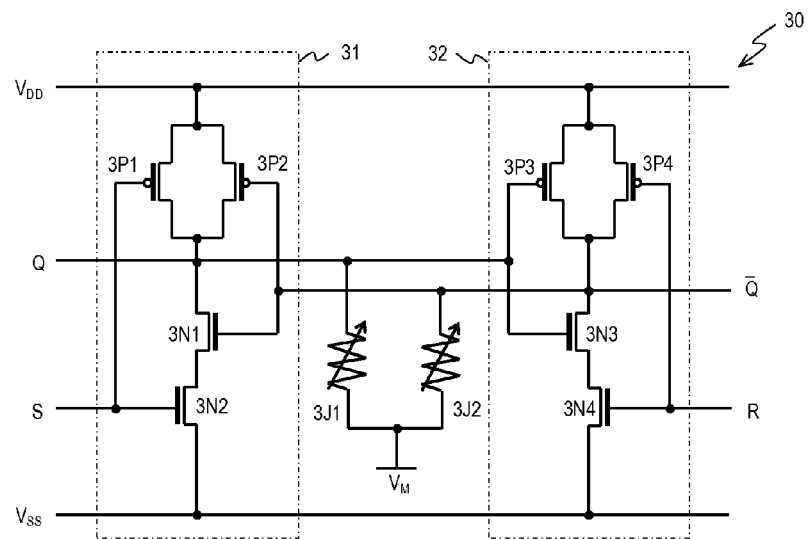
FIGS. 3A, 3B and 3C are a transistor-level, gate-level and block-level circuit diagrams, respectively, of a nonvolatile NAND-based SR-latch according to a second embodiment of the present disclosure.
Figures 3B, 3C:
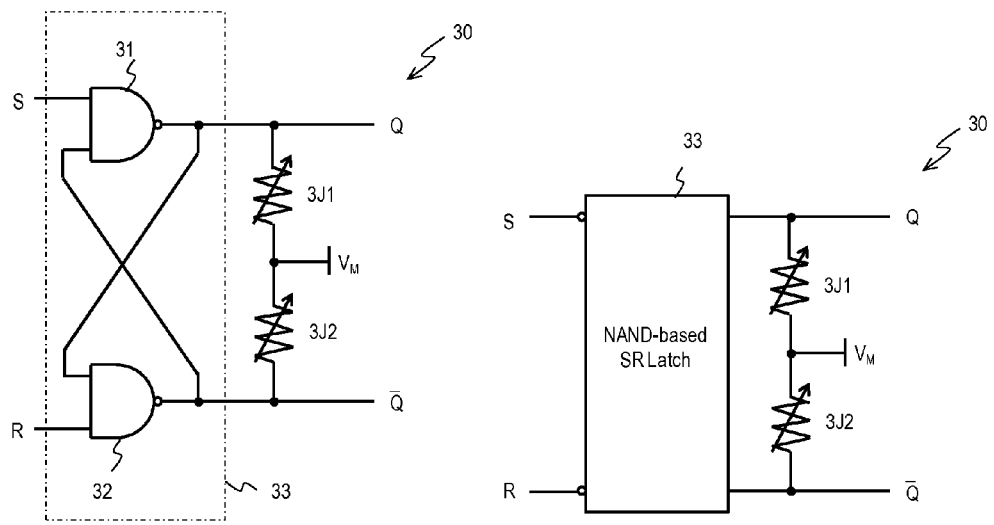

The SR-latch circuit can be built by using two NAND gates instead of using two NOR gates. FIGS. 3A-3C show a transistor-level, gate-level and block-level circuit diagrams, respectively, of an nonvolatile NAND-based SR-latch 30 according to a second embodiment of the present disclosure.

The transistor-level circuit of the nonvolatile SR-latch 30 is shown in FIG. 3A. It comprises two cross-coupled CMOS-based NAND gates 31 and 32. Each gate has two input terminals. Note that the number of inputs can be any. One input terminal of each NAND gate is coupled to an output terminal of another gate. Another input terminal of the gates 31 and 32 can be used to enable switching of the latch 30.

The 2-input NAND gate 31 can comprise two pMOS transistors 3P1 and 3P2 connected in parallel and two nMOS transistors 3N1 and 3N2 connected in series to each other. Respectively, the 2-input NAND gate 32 comprises two pMOS transistors 3P3 and 3P4 connected in parallel to each other and two nMOS transistors 3N3 and 3N4 connected in series. The gate 31 further comprises an input terminal for applying a set input S and an output terminal Q. Respectively, the NAND gate 32 comprises a reset input terminal R and an output terminal $\overline{Q}$ (a complement of Q). The output terminal Q of the gate 31 is electrically coupled to another input terminal of the gate 32 formed by gates of the transistors 3P3 and 3N3. Respectively, the output terminal $\overline{Q}$ of the gate 32 is electrically connected to another input terminal of the gate 31 formed by the gates of the transistors 3P2 and 3N1.

To provide a non-volatility to the SR-latch 30 two MR elements 3J1 and 3J2 can be used. The MR element 3J1 is electrically coupled to the output terminal Q of the NAND gate 31 at its first end and to a memory voltage source $V_M$ at its second end. The MR element 3J1 can provide a nonvolatile storage of a logic state of the output terminal Q. Respectively, the MR element 3J2 is electrically coupled to the output terminal $\overline{Q}$ of the NAND gate 32 at its first end and to the voltage source $V_M$ at its second end. The MR element 3J2 can provide a non-volatile storage of the logic state $\overline{Q}$ of the gate 32. Source terminals of pMOS transistors 3P1-3P4 are electrically coupled to a voltage source $V_{DD}$. Respectively, source terminals of the nMOS transistors 3N2 and 3N4 are electrically coupled to a voltage source $V_{SS}$, wherein $V_{DD}>V_M>V_{SS}$. Note that the source terminals of the nMOS transistors 3N2 and 3N4 can be coupled to a grounding source GRD ($V_{DD}>V_M>$GRD). The MR elements 3J1 and 3J2 can also be connected to the grounding source GRD at the following condition: $V_{DD}>$GRD$>V_{SS}$.

The transistor-level circuit diagram of the NAND-based SR-latch 30 is shown in FIG. 3A. In order to preserve (hold) a previous state of the latch 30, both inputs S and R can be equal to logic "1" (S=R=1). To set a new logic state of the latch 30 the set input S=0 and resent input R=1 can be applied. For this combination of the input signals the output Q can be equal to a logic "1" (Q=1) and the complementary output $\overline{Q}$ can be equal to a logic "0" ($\overline{Q}$=0). Hence, in order to set the NAND-based SR-latch 30, the logic "0" could be applied to the set input terminal S. Respectively, in order to reset the latch 30, the logic "0" could be applied to the resent input terminal R. The following combination of the input signals S=R=0 is not allowed since it violates the complementarity of the two outputs Q and $\overline{Q}$. A truth table of the NAND-based SR-latch 30 is given in Table 2.

TABLE 2

Truth Table of the NAND-based SR-latch

| Input | | Output | | |
|---|---|---|---|---|
| S | R | $Q_{N+1}$ | $\overline{Q}_{N+1}$ | Operation |
| 0 | 0 | 1 | 1 | Restricted combination |
| 0 | 1 | 1 | 0 | Set |
| 1 | 0 | 0 | 1 | Reset |
| 1 | 1 | $Q_N$ | $\overline{Q}_N$ | Hold previous state |

When the following combination of the input signals (S=0 and R=1) is applied, the pMOS transistor 3P1 of the NAND-gate 31 is "On" but the nMOS transistor 3N2 is "Off". A spin-polarized current $I_S$ can occur in the MR element 3J1 running in the direction from the voltage source $V_{DD}$ to the voltage source $V_M$. This direction of the current $I_S$ in the MR element 3J1 can force the magnetization direction of the free layer 12 (see FIG. 1) in antiparallel to the magnetization direction of the pinned layer 14. The antiparallel configuration of the magnetizations in the free and pinned layers corresponds to the highest resistance (logic "1"). Hence, the MR element 3J1 can receive a logic "1" when S=0. Respective, the input signal R=1 can force the pMOS transistor 3P4 of the gate 32 in "Off" state but both the nMOS transistors 3N3 and 3N4 (Q=1 is applied to the gate of the nMOS transistor 3N3) can be "On". A spin-polarized current $I_S$ can occur in the MR element 3J2 running in a direction from the source $V_M$ to the source $V_{SS}$. This direction of the spin-polarized current $I_S$ can force the magnetization direction of the free layer of the MR element 3J2 in parallel to the magnetization direction of the pinned layer (FIG. 1). The parallel configuration of the magnetization directions in the free and pinned layers of the MR element 3J2 corresponds to the lowest resistance value or to a logic "0". Hence, the MR elements 3J1 and 3J2 could replicate the logic values of the output terminals Q and $\overline{Q}$, respectively.

Figure 4A:
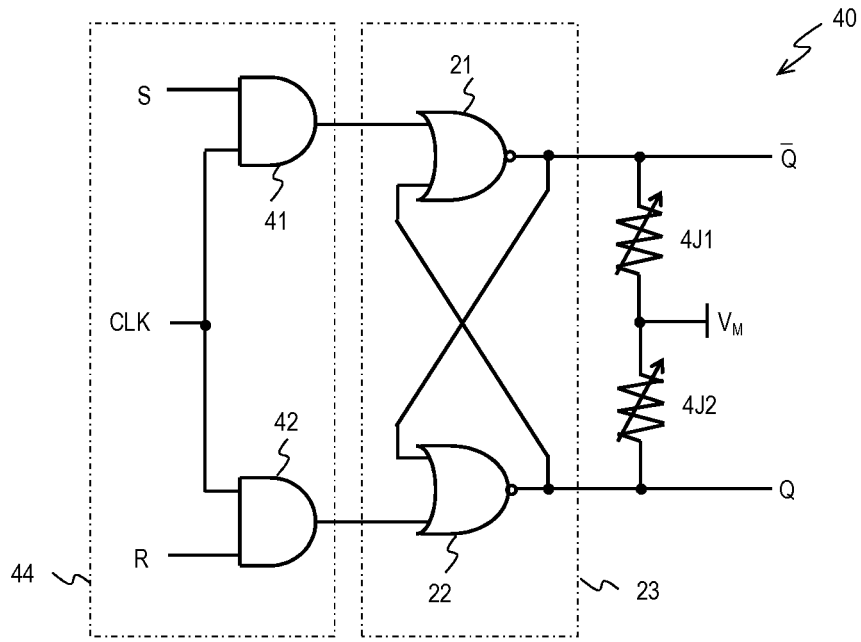
FIGS. 4A and 4B are a gate-level and block-level circuit diagrams, respectively, of a nonvolatile clocked NOR-based SR-latch according to a third embodiment of the present disclosure.
Figure 4B:
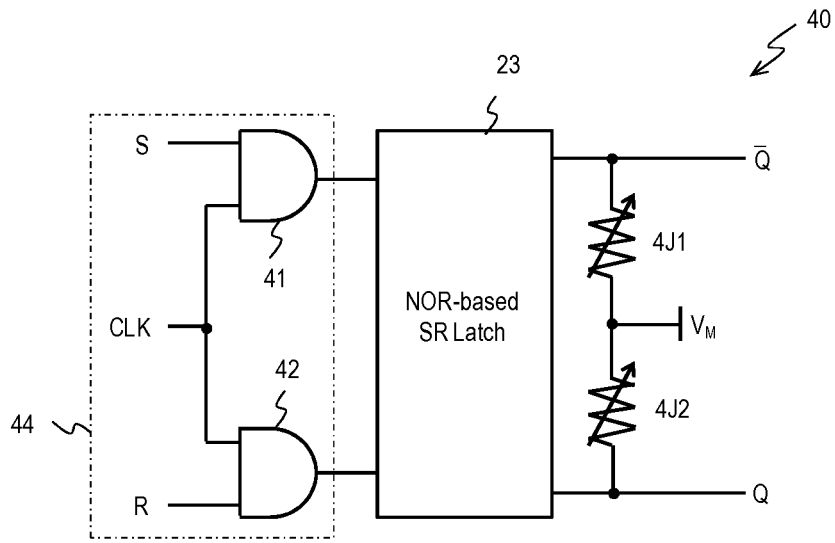

FIGS. 4A and 4B show a gate-level and block-level circuit diagrams, respectively, of a nonvolatile clocked NOR-based SR-latch 40. The clocked latch 40 comprises the NOR-based SR-latch 23 made of the cross-coupled NOR logic gates 21 and 22, MR elements 4J1 and 4J2, and a clock signal circuitry 44. The clock signal circuitry 44 works as a synchronized gate for input signals of the latch. The outputs Q and $\overline{Q}$ of the latch 40 can respond to the input signals S and R only during an active period of a clock signal CLK (pulse). The clock circuitry 44 comprises two AND gates 41 and 42 having a common clock terminal CLK. An output terminal of the gate 41 is connected to the input set S terminal of the SR-latch 23. Respectively, an output terminal of the AND gate 42 is electrically coupled to the input reset R terminal of the SR-latch 23. Output terminals Q and $\overline{Q}$ of the latch 40 are connected to the MR elements 4J1 and 4J2, respectively. The memory element 4J1 can provide a nonvolatile storage of the logic state of the output $\overline{Q}$ while the element 4J2 can preserve the logic level of the output Q. The MR element 4J1 and 4J2 are electrically coupled at their second ends to the memory voltage source $V_M$.

When a clock signal CLK=0 is applied to the clock terminal, the input signals S and R could not affect the logic state of the SR-latch 23 since the outputs of the AND gates 41 and 42 could remain at a logic "0". When the clock signal CLK=1, the input signals S and R are permitted to be applied to the inputs of the SR-latch 23, hence the logic state of the latch can be changed. Note that as in the conventional SR-latch 20 shown in FIG. 2 the combination of the signals S=R=1 is not allowed in the clocked SR-latch 40. At the condition S=R=1 an occurrence of the clock input CLK=1 may cause the output combination Q=$\overline{Q}$=0 that is not allowed since it violates the complementarity. When the clock signal will switch to CLK=0, the state of the latch 40 is indeterminate. It can be settle into any state depending on difference in delay time between the output signals Q and $\overline{Q}$.

Figure 5A:
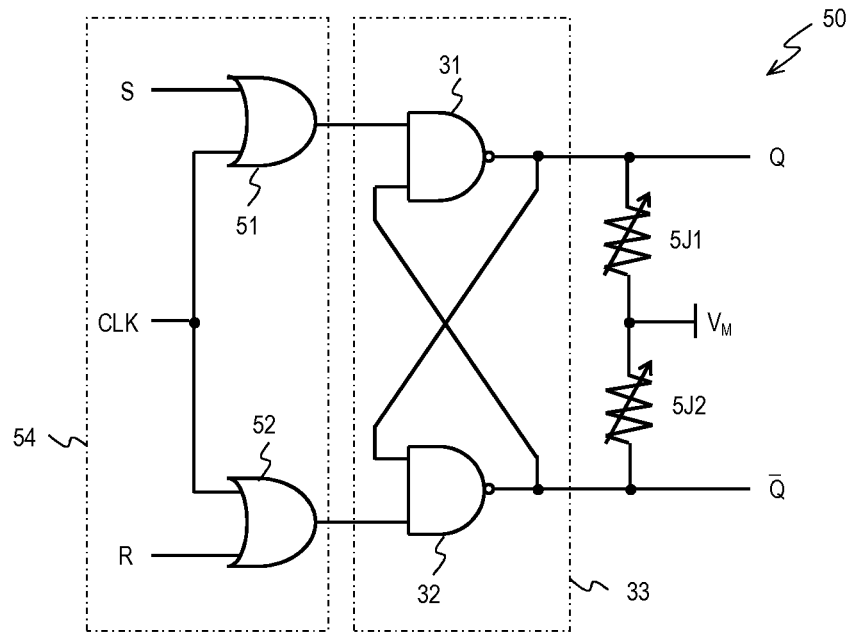
FIGS. 5A and 5B are a gate-level and block-level circuit diagrams, respectively, of a nonvolatile clocked NAND-based SR-latch with active low inputs according to a fourth embodiment of the present disclosure.
Figure 5B:
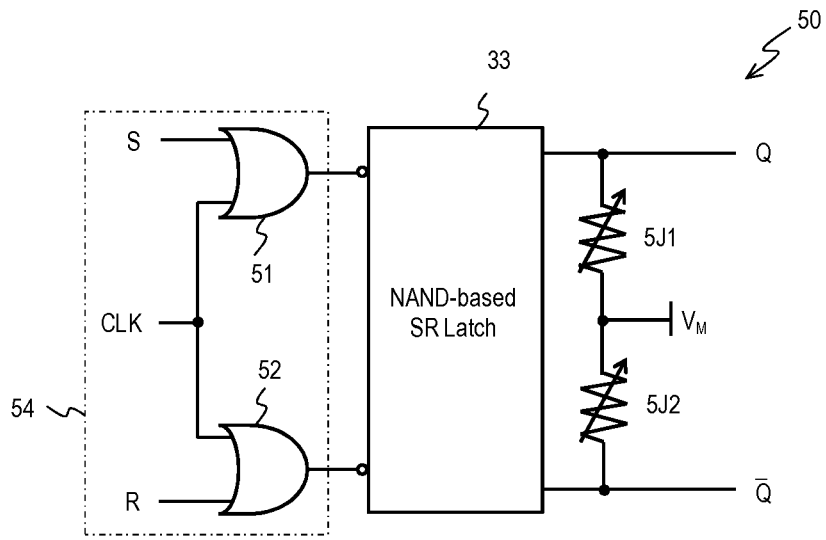

FIGS. 5A and 5B show a gate-level and block-level circuit diagrams, respectively, of a nonvolatile clocked NAND-based SR-latch 50. The clocked latch 50 comprises a clock signal circuitry 54 made of two OR logic gates 51 and 52 that is coupled to the S and R input terminals of the NAND-based latch 33, respectively. Non-volatility of the latch 50 can be provided by two MR elements 5J1 and 5J2 electrically connected to the output terminals Q and $\overline{Q}$, respectively at their first ends. Second ends of the memory elements 5J1 and 5J2 are electrically coupled to the memory voltage source $V_M$. The clocked latch 50 is closed (opaque) when the clock input signal CLK=1. Hence, any combination of the input signals S and R can be ignored. The latch can become opened (transparent) for the input signals S and R when the clock signal CLK=0.

Figure 6A:
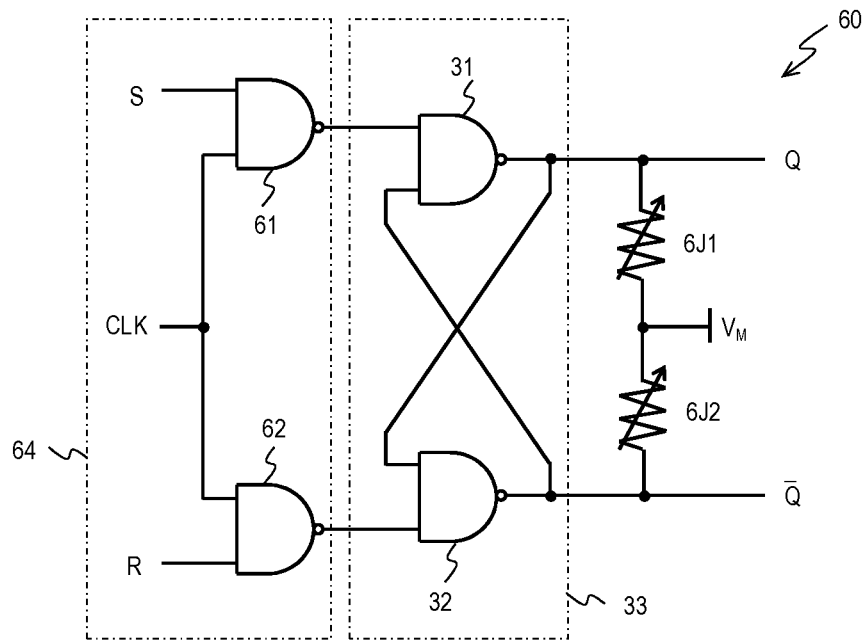
FIGS. 6A and 6B are a gate-level and block-level circuit diagrams, respectively, of a nonvolatile clocked NAND-based SR-latch with active high inputs according to a fifth embodiment of the present disclosure.
Figure 6B:
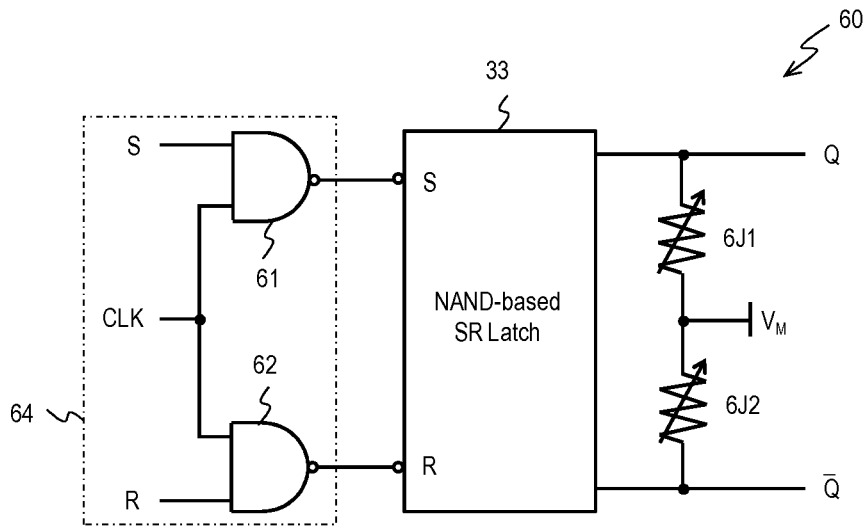

A different implementation of the nonvolatile clocked NAND-based SR-latch is shown in FIGS. 6A and 6B. The latch 60 comprises four NAND logic gates 31, 32, 61 and 62 (FIG. 6A). The logic gates 61 and 62 compose a clock signal circuitry 64. Output terminals of the NAND gates 61 and 62 are connected to the S and R input terminals, respectively, of the NAND-based SR-latch 33 composed by the logic gates 31 and 32. MR elements 6J1 and 6J2 can provide a non-volatile storage of the logic state Q and $\overline{Q}$, respectively. The latch 60 can be set at the following combination of the input signals: CLK=1, S=1, and R=0. Similarly, the latch 60 can be reset when CLK=1, S=0, and R=1.

Figure 7A:
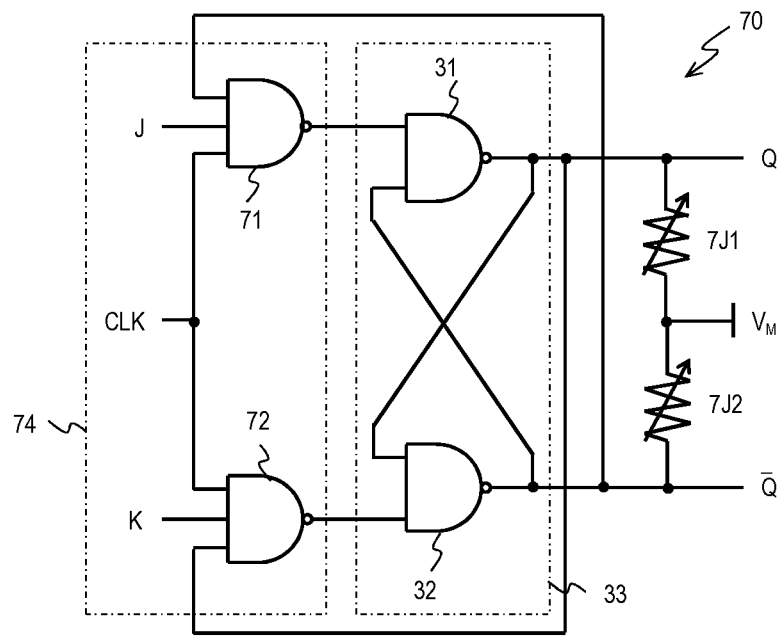
FIGS. 7A and 7B are a gate-level and block-level circuit diagrams, respectively, of a nonvolatile clocked NAND-based JK-latch according to a sixth embodiment of the present disclosure.
Figure 7B:
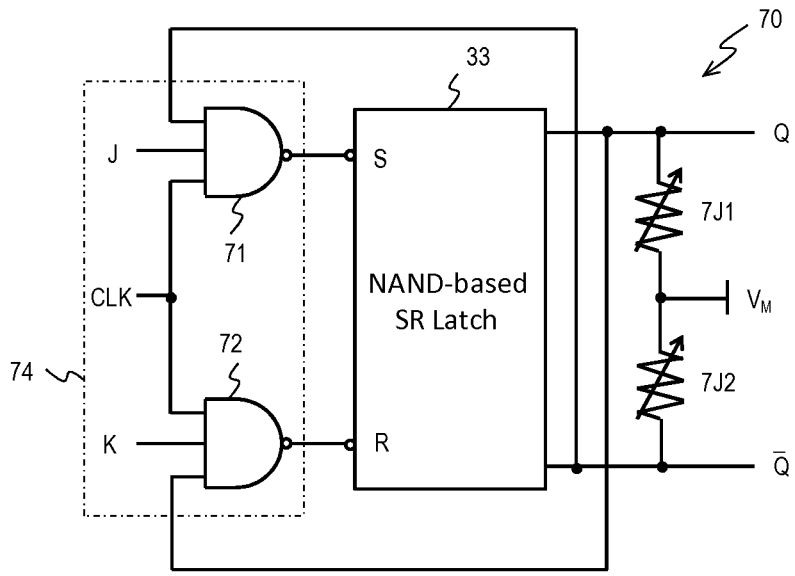

The nonvolatile SR-latches 20, 30, 40, 50, and 60 suffer from the common problem. All of them have restricted combinations of the input signals S and R. This problem can be overcome by using JK-latch. FIGS. 7A and 7B show gate-level and block-level circuit diagrams, respectively, of nonvolatile JK-latch 70. The latch 70 (FIG. 7A) comprises four NAND logic gates 31, 32, 71, and 72, and two MR elements 7J1 and 7J2 connected to output terminals Q and $\overline{Q}$. The logic gates 71 and 72 compose a clock input circuitry 74. The cross-coupled gates 31 and 32 form the NAND-based SR-latch 33. To avoid restricted combinations of the input signals the latch 70 has two feedback lines, for instance, the output terminal Q is electrically coupled to one of the input terminals of the NAND gate 72, and the output terminal $\overline{Q}$ is connected to one of the input terminals of the gate 71.

The J and K inputs of the latch 70 corresponds to the set and reset inputs of the SR-latches 20 and 30. When the clock is active (CLK=1), the latch 70 can be set with the input combination J=1 and K=0. The latch 70 can be reset when the following combination of the inputs signal is applied: CLK=1, J=0, and K=1. If the inputs signals J=K=0 during the active clock (CLK=1) are applied, the latch 70 can preserve its previous logic state. In case of input combination CLK=J=K=1, the latch 70 can switch its logic state due to feedback. The JK-latch 70 can hold its logic state when the clock is inactive CLK=0. The truth table of the JK-latch 70 is given in Table 3.

TABLE 3

Truth Table of the JK-latch

| J | K | $Q_N$ | $\overline{Q}_N$ | S | R | $Q_{N+1}$ | $\overline{Q}_{N+1}$ | Operation |
|---|---|---|---|---|---|---|---|---|
| 0 | 0 | 0 | 1 | 1 | 1 | 0 | 1 | Hold |
|   |   | 1 | 0 | 1 | 1 | 1 | 0 |   |
| 1 | 0 | 0 | 1 | 0 | 1 | 1 | 0 | Set |
|   |   | 1 | 0 | 1 | 1 | 1 | 0 |   |
| 0 | 1 | 0 | 1 | 1 | 1 | 0 | 1 | Reset |
|   |   | 1 | 0 | 1 | 0 | 0 | 1 |   |
| 1 | 1 | 0 | 1 | 0 | 1 | 1 | 0 | Toggle |
|   |   | 1 | 0 | 1 | 0 | 0 | 1 |   |

Figure 8A:
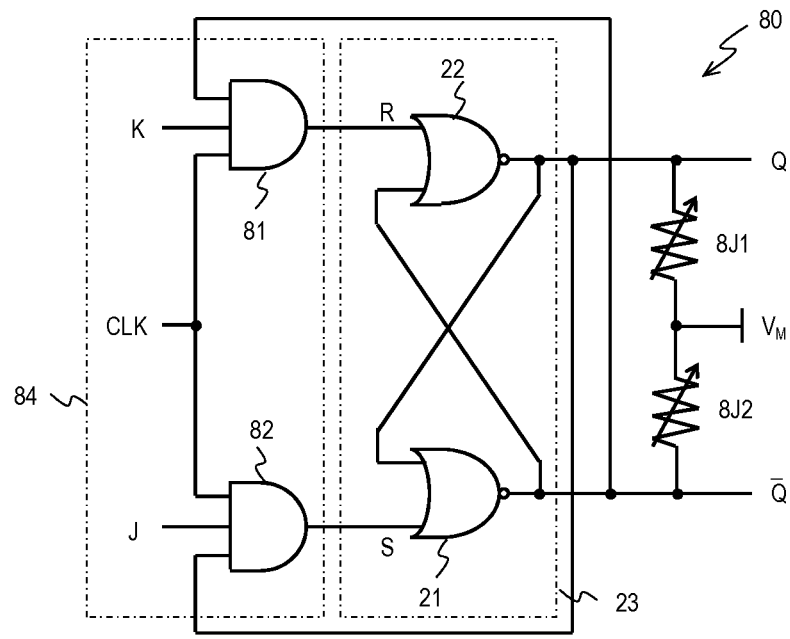
FIGS. 8A and 8B are a gate-level and block-level circuit diagrams, respectively, of a nonvolatile clocked NOR-based JK-latch according to a seventh embodiment of the present disclosure.
Figure 8B:
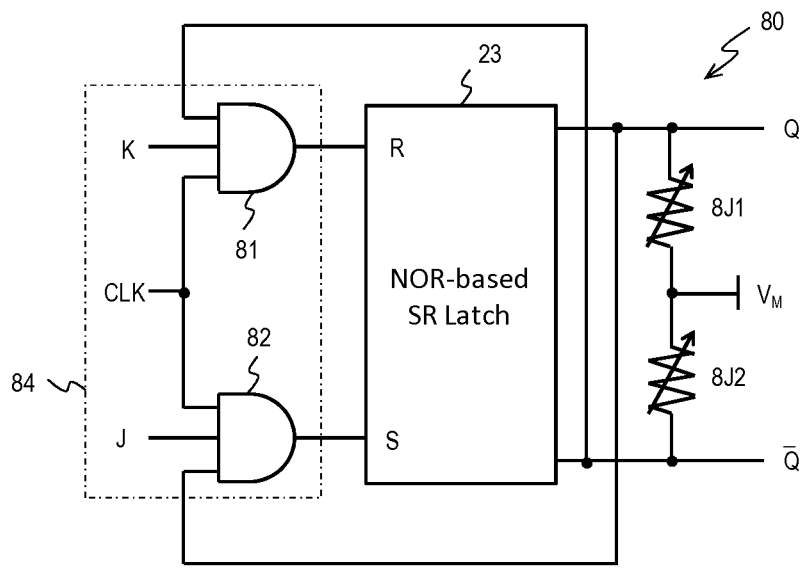

FIGS. 8A and 8B illustrate gate-level and block-level circuit diagrams, respectively, of an alternative NOR-based implementation of the nonvolatile clocked JK-latch 80. The JK-latch 80 comprises two AND logic gates 81 and 82 that compose a clock input circuitry 84. The gates 81 and 82 are electrically coupled to the input of the NOR-based SR-latch 23 formed by two NOR gates 21 and 22. The non-volatility of the JK-latch 80 can be provided by two MR elements 8J1 and 8J2 connected to the output terminals Q and $\overline{Q}$, respectively.

Figure 9:
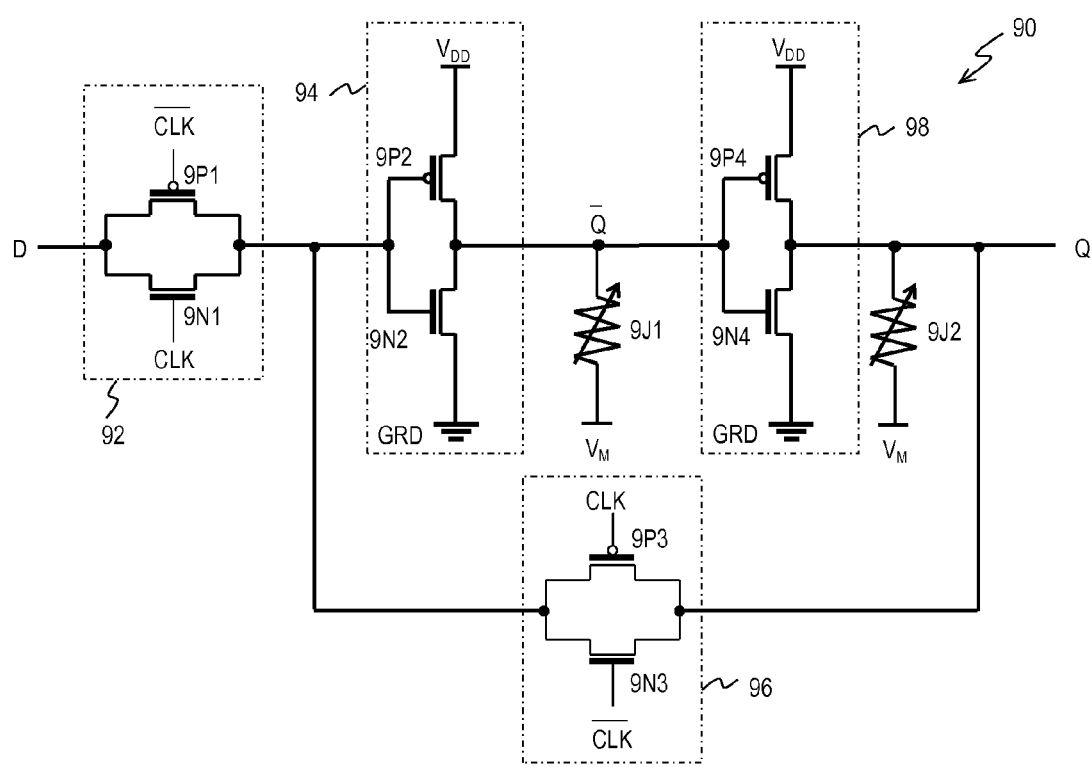
FIG. 9 is a transistor-level circuit diagram of a nonvolatile D-latch according to an eight embodiment of the present disclosure.

FIG. 9 shows a transistor-level circuit diagram of a nonvolatile D-latch 90. The D-latch 90 can comprise two transmission gates 92 and 96, two inverters 94 and 98, and two MR elements 9J1 and 9J2. The MR element 9J1 is connected at its first end to the output terminal of the transmission gate 94 and can provide a nonvolatile storage of the value $\overline{Q}$. The element 9J2 is connected at its first end to the output terminal of the inverter 98 and can provide a nonvolatile storage of the output signal Q. Source terminals of the pMOS transistors 9P2 and 9P4 of the inverters 94 and 98 are connected to the voltage source $V_{DD}$. Respectively, the source terminals of the nMOS transistors 9N2 and 9N4 are electrically coupled to the voltage source $V_{SS}$ (the source $V_{SS}$ is shown as a grounding source GRD). The MR elements 9J1 and 9J2 are connected to the memory voltage source $V_M$ at their second end, wherein $V_{DD} > V_M > GRD$.

The transmission gate 92 is composed by an pMOS transistor 9P1 and nMOS transistor 9N1 connected in parallel to each other. The transmission gate 92 can be activated by the clock signal CLK=1. Contrarily, the transmission gate 96, composed by transistors 9P3 and 9N3 can be activated by the inverse of the clock signal $\overline{CLK}$. When a clock signal CLK=1 is applied, the transmission gate 92 can become transparent for the data input D. At D=1 the pMOS transistor 9P2 is "Off" but the nMOS transistor 9N2 is "On". This corresponds to $\overline{Q}=0$ at the output terminal. A spin-polarized current $I_S$ running in the MR element 9J1 in a direction from the source $V_M$ to the source GRD can occur. At the given direction of the current $I_S$ the MR element 9J1 having a multilayer structure shown in FIG. 1 can be switched to the low resistance state (logic "0"). When the signal $\overline{Q}=0$ is applied to the common gate terminal of the inverter 98, the pMOS transistor 9P4 is "On" but the nMOS transistor 9N4 is "Off". The spin-polarized current $I_S$ can occur in the MR element 9J2 running in the direction from the voltage source $V_{DD}$ to the source $V_M$. The spin-polarized current of the given direction can switch the MR element 9J2 into a high resistance state (logic "1"). During CLK=1 the transmission gate 96 is closed (opaque).

Figure 10:
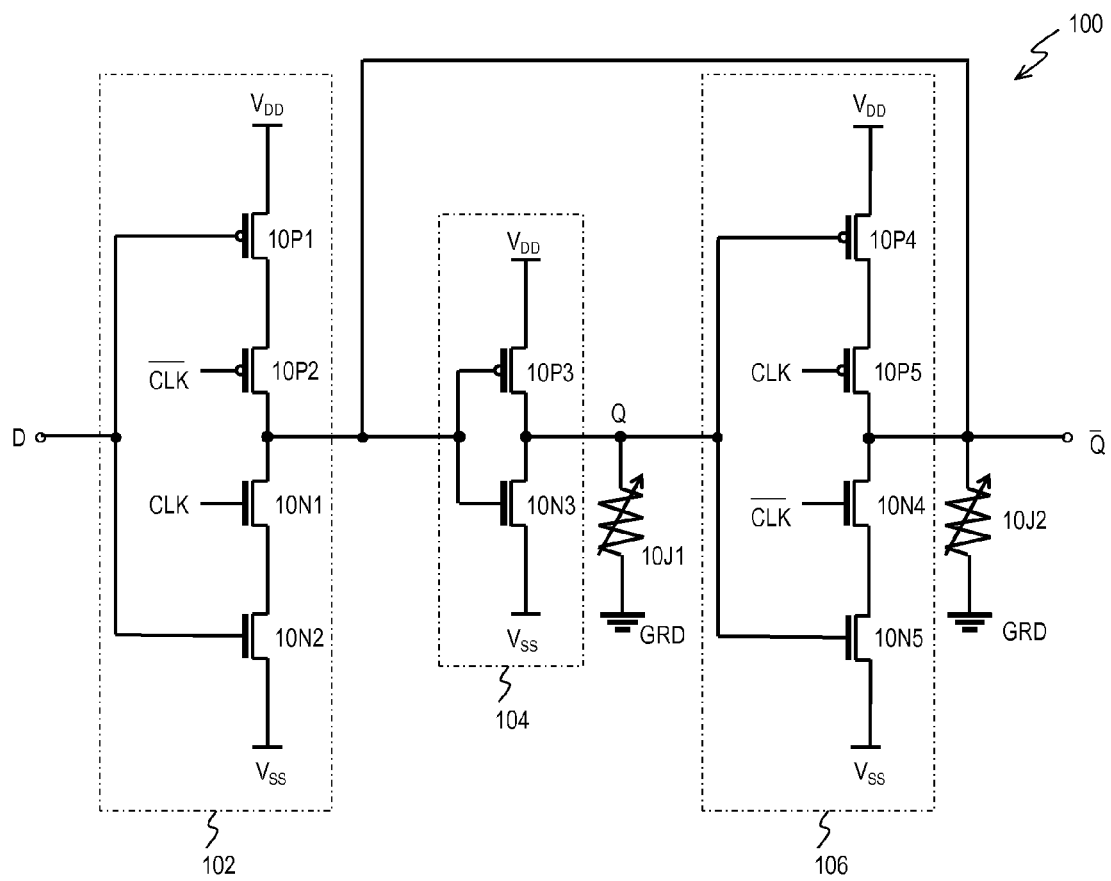
FIG. 10 is a transistor-level circuit diagram of a nonvolatile D-latch according to a ninth embodiment of the present disclosure.

FIG. 10 shows a transistor-level circuit diagram of another version of a nonvolatile D-latch 100. The latch 100 comprises an inverter 104, two tristate inverters 102 (transistors 10P1, 10P2, 10N1, and 10N2) and 106 (transistors 10P4, 10P5, 10N4, and 10N5), and two MR elements 10J1 and 10J2. The MR element 10J1 is electrically coupled to an output terminal of the inverter 104 to preserve Q value. The element 10J2 is connected to the output of the tristate inverter 106 and can store $\overline{Q}$ value. The outputs of the tristate inverters 102 and 106 are coupled by a feedback line. An operation principle of the latch 100 is the same as of the latch 90 (FIG. 9) described above.

Figure 11:
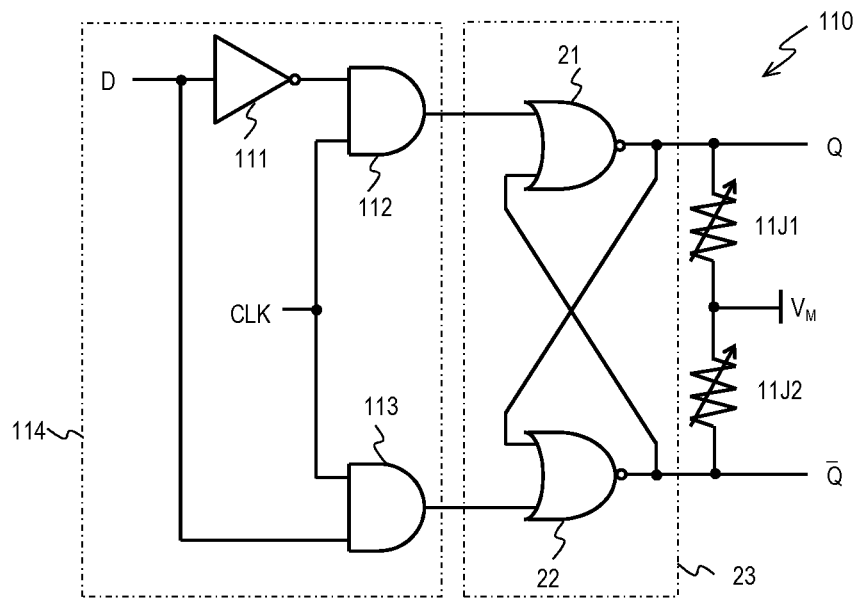
FIG. 11 is a gate-level circuit diagram of a nonvolatile NOR-based D-latch according to a tenth embodiment of the present disclosure.

FIG. 11 shows a gate-level circuit diagram of a nonvolatile D-latch 110. The latch 110 is obtained by modifying the nonvolatile clocked NOR-based SR-latch 40 shown in FIGS. 4A and 4B. The D-latch 110 comprises a clock signal circuit 114 composed by an inverter 111 and two AND logic gates 112 and 113, and the NOR-based SR-latch 23. The latch 110 has a single input terminal D, which is connected to the S input through inverter 111. The input terminal D is also connected to the R input of the latch. The output Q assumes the value of the input D when the clock is active (CLK=1). MR elements 11J1 and 11J2 can provide a non-volatility to the D-latch 110. They are electrically coupled to the output terminals Q and $\overline{Q}$, respectively.

Figure 12:
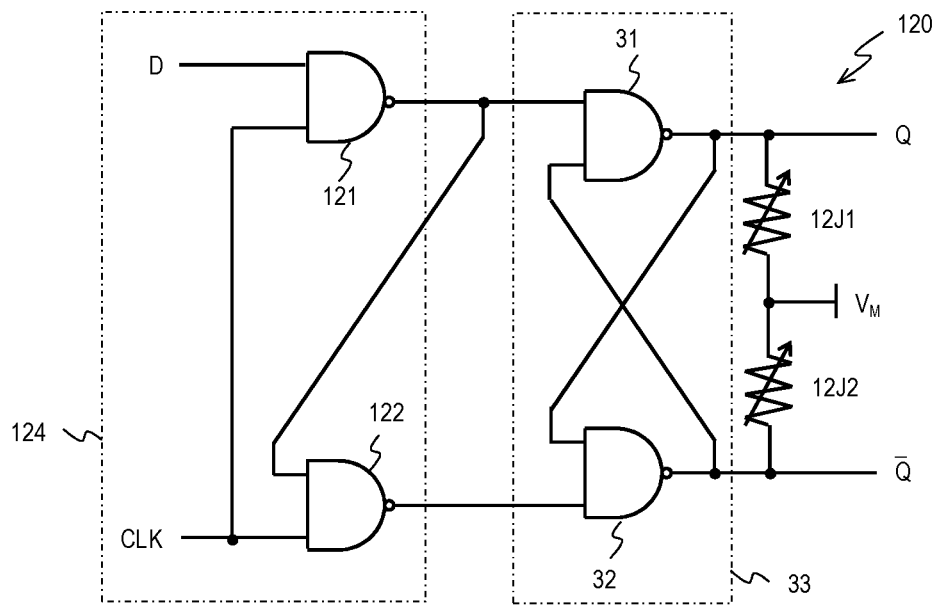
FIG. 12 is a gate-level circuit diagram of a nonvolatile NAND-based D-latch according to an eleventh embodiment of the present disclosure.

FIG. 12 shows a gate-level circuit diagram of a nonvolatile NAND-based D-latch 120. The latch 120 comprises a clock signal circuit 124 composed by NAND logic gates 121 and 122, and the NAND-based SR-latch 33. A non-volatility of the d-latch 120 can be provided by two MR elements 12J1 and 12J2 connected to the output terminals Q and $\overline{Q}$, respectively.

Figure 13:
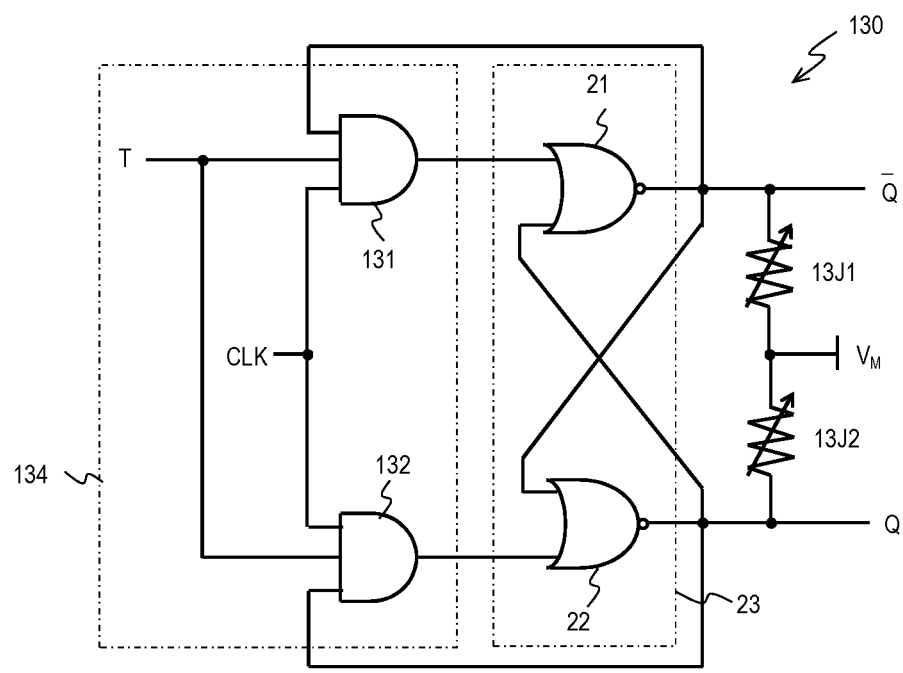
FIG. 13 is a gate-level circuit diagram of a nonvolatile NOR-based T-latch according to a twelfth embodiment of the present disclosure.
Figure 14:
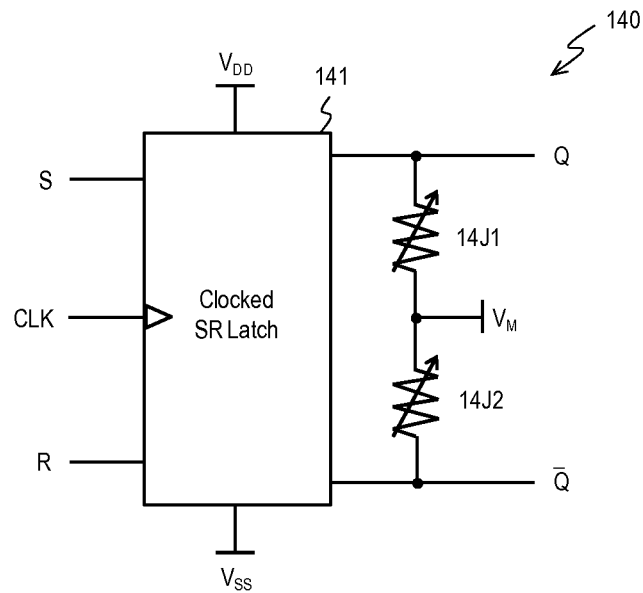
FIG. 14 is a block-level circuit diagram of a nonvolatile clocked SR-latch according to the present disclosure.
Figure 15:
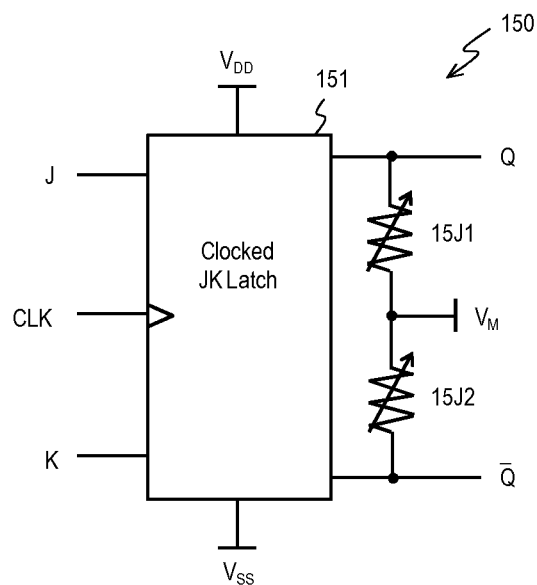
FIG. 15 is a block-level circuit diagram of a nonvolatile clocked JK-latch according to the present disclosure.
Figure 16:
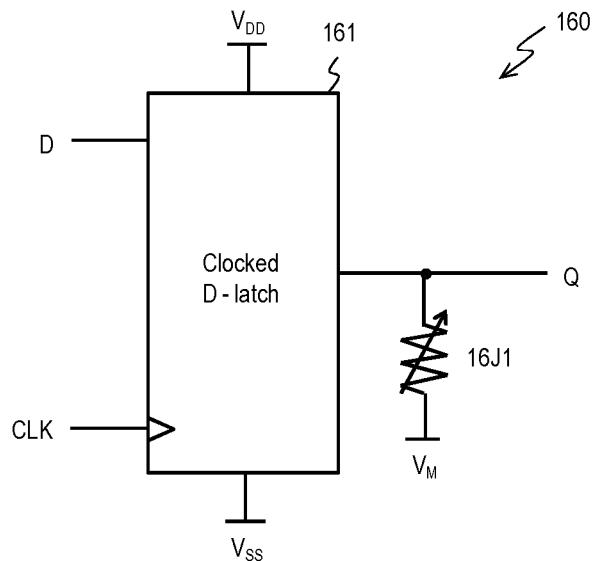
FIG. 16 is a block-level circuit diagram of a nonvolatile clocked D-latch according to the present disclosure.
Figure 17:
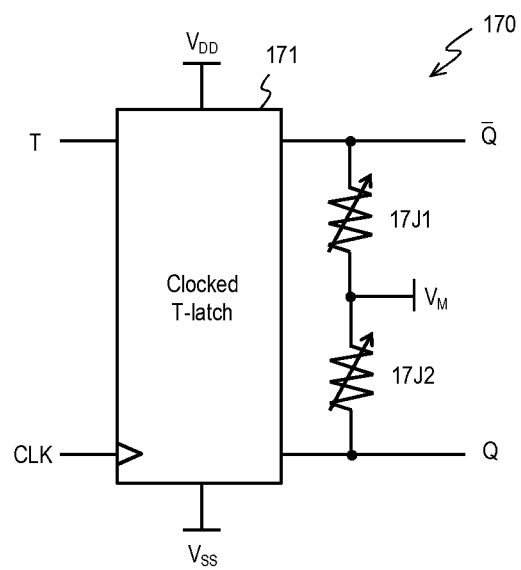
FIG. 17 is a block-level circuit diagram of a nonvolatile clocked T-latch according to the present disclosure.

A gate-level circuit diagram of a nonvolatile NOR-based T-latch 130 is shown in FIG. 13. The T-latch 130 represents a modification of the JK-latch shown in FIGS. 8A and 8B where the input terminals J and K are shorted. The latch 130 comprises a clock signal circuit 134 composed by two AND logic gates 131 and 132, and the NOR-based SR-latch 23. The latch can toggle when the clock input CLK=1. The MR elements 13J1 and 13J2 are connected to the output terminals of the latch 130 and can preserve the logic states of $\overline{Q}$ and Q, respectively.

FIGS. 14-17 show a block-level circuit diagrams of the clocked SR-latch, JK-latch, D-latch, and T-latch, respectively. All of them comprise a logic circuitry (for example SR-latch 140 comprises the logic circuitry 141, the latch 150 comprises the circuitry 151, and similar for the latches 160 and 170), at least one input signal terminal, a clock signal terminal CLK, and an output terminal Q (or $\overline{Q}$). Number of input and output terminals can vary. The number of the nonvolatile MR elements preserving logic value of the output terminals can vary as well. For example, the nonvolatile D-latch 160 shown in FIG. 16 comprises one MR element 16J1 that can store the logic value of the output Q. The logic circuitry can be powered by voltage sources $V_{DD}$ and $V_{SS}$. The MR elements are electrically coupled to the output terminals (one element per terminal) at their first ends and to the memory (or intermediate) voltage source $V_M$ at their second ends, wherein $V_{DD} > V_M > V_{SS}$. Note that one of the voltage sources can be replaced by a grounding source GRD, for example $V_{DD} > GRD > V_{SS}$. The MR elements can provide a nonvolatile storage of the values Q and $\overline{Q}$.

The latch circuits disclosed above (FIGS. 2-17) employ the MR elements as nonvolatile memory elements. A number of the MR elements can be less than the number of the output terminals of the latch preserving one of the Q or $\overline{Q}$ values. Note that the MR elements can be replaced by other nonvolatile memory elements such as a phase change memory element, resistive memory element and others without departing from the scope of the present disclosure.

The disclosed nonvolatile latch circuits comprise the nonvolatile memory elements disposed above a CMOS logic circuitry formed on a wafer. The embedded nonvolatile memory elements can have a marginal impact on a design and manufacturing process of the conventional volatile CMOS-based latch circuits.

While the specification of this disclosure contains many specifics, these should not be construed as limitations on the scope of the disclosure or of what may be claimed, but rather as descriptions of features specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

It is understood that the above embodiments are intended to be illustrative, and not restrictive. Many other embodiments will be apparent to those of skill in the art upon reviewing the above description. The scope of the embodiments should be, therefore, determined with reference to the appended claims, along with the full scope of equivalents to which such claims are entitled.

While the disclosure has been described in terms of several exemplary embodiments, those skilled in the art will recognize that the disclosure can be practiced with modification within the spirit and scope of the appended claims. Specifically, one of ordinary skill in the art will understand that the drawings herein are meant to be illustrative, and the spirit and scope of the disclosure are not limited to the embodiments and aspects disclosed herein but may be modified.

What is claimed is:

1. A nonvolatile latch circuit comprising:
   a first input signal terminal;
   a second input signal terminal;
   a first logic gate electrically coupled to a high voltage source at a first source terminal and to a low voltage source at a second source terminal;
   a second logic gate electrically coupled to the high voltage source at a first source terminal and to the low voltage source at a second source terminal, the first and second logic gates are electrically cross-coupled to each other, and
   a first nonvolatile memory element electrically coupled to an output terminal of the first logic gate at a first end and to an intermediate voltage source at a second end,
   wherein a logic state of the first nonvolatile memory element is controlled by a bidirectional current running between the first and second ends of the first nonvolatile memory element, and
   wherein an electrical potential of the intermediate voltage source is fixed and higher than that of the low voltage source but lower than that of the high voltage source.

2. The nonvolatile latch circuit of claim 1, further comprising a second nonvolatile memory element electrically coupled to an output terminal of the second logic gate at a first end and to the intermediate voltage source at a second end.

3. The nonvolatile latch circuit of claim 2, wherein the first and second nonvolatile memory elements are magnetoresistive elements.

4. The nonvolatile latch circuit of claim 3, wherein each of the magnetoresistive elements comprises at least a free ferromagnetic layer comprising a reversible magnetization direction, a pinned ferromagnetic layer comprising a fixed magnetization direction, and a nonmagnetic insulating tunnel barrier layer disposed between the free and pinned layers.

5. The nonvolatile latch circuit of claim 4, wherein the reversible magnetization direction of the free ferromagnetic layer comprises a first logic state that is parallel to the fixed magnetization direction of the pinned layer and a second logic state that is antiparallel to the fixed magnetization direction of the pinned layer.

6. The nonvolatile latch circuit of claim 4, wherein the reversible and fixed magnetization directions of the free and pinned ferromagnetic layers, respectively are substantially perpendicular to a layers surface.

7. The nonvolatile latch circuit of claim 4, wherein the reversible and fixed magnetization directions of the free and pinned ferromagnetic layers, respectively are substantially parallel to the layers surface.

8. The nonvolatile latch circuit of claim 2, wherein the nonvolatile memory elements comprise a phase change material which has a high resistance state when it is in an amorphous state and has a low resistance state when it is in a crystalline state.

9. The nonvolatile latch circuit of claim 1, further comprising:
   a clock signal circuitry comprising a clock signal terminal, the clock signal circuitry is electrically coupled to the first and second logic gates,
   wherein a logic state of the first and second logic gates responds to an input signal during an active period of a clock signal.

10. A nonvolatile latch circuit comprising:
    a bistable logic circuitry comprising a first input signal terminal, a clock signal terminal, and a first output terminal, the bistable logic circuitry is electrically coupled to a high voltage source at a first source terminal and to a low voltage source at a second source terminal, and
    a first nonvolatile memory element electrically coupled to first output terminal at a first end and to an intermediate voltage source at a second end,
    wherein a logic state of the bistable logic circuitry responds to an input signal during an active period of a clock signal,
    wherein a logic state of the first nonvolatile memory element is controlled by a bidirectional current running between the first and second ends of the first nonvolatile memory element, and
    wherein an electrical potential of the intermediate voltage source is fixed and higher than that of the low voltage source but lower than that of the high voltage source.

11. The nonvolatile latch circuit of claim 10, wherein the nonvolatile memory element is a magnetoresistive element.

12. The nonvolatile latch circuit of claim 11, wherein the magnetoresistive element comprises at least a free ferromagnetic layer comprising a reversible magnetization direction, a pinned ferromagnetic layer comprising a fixed magnetization direction, and a nonmagnetic insulating tunnel barrier layer disposed between the free and pinned layers.

13. The nonvolatile latch circuit of claim 12, wherein the reversible magnetization direction of the free ferromagnetic layer comprises a first logic state that is parallel to the fixed magnetization direction of the pinned layer and a second logic state that is antiparallel to the fixed magnetization direction of the pinned layer.

14. The nonvolatile latch circuit of claim 10, wherein the nonvolatile memory element comprises a phase change material which has a high resistance state when it is in an amorphous state and has a low resistance state when it is in a crystalline state.

15. The nonvolatile latch circuit of claim 10, further comprising a second input signal terminal.

16. The nonvolatile latch circuit of claim 10, further comprising a second output terminal.

17. The nonvolatile latch circuit of claim 16, further comprising a second nonvolatile memory element electrically coupled to the second output terminal at a first end and to the intermediate voltage source at a second end.

18. A nonvolatile latch circuit comprising:
a first input signal terminal;
a second input signal terminal;
a first logic gate electrically coupled to a high voltage source at a first source terminal and to a low voltage source at a second source terminal;
a second logic gate electrically coupled to the high voltage source at a first source terminal and to the low voltage source at a second source terminal, the first and second logic gates are electrically cross-coupled to each other;
a clock signal circuitry comprising a clock signal terminal, the clock signal circuitry is electrically coupled to the first and second logic gates, and
a first nonvolatile memory element being electrically coupled between an output terminal of the first logic gate and an intermediate voltage source,
wherein a logic state of the first and second logic gates responds to an input signal during an active period of a clock signal,
wherein a logic state of the first nonvolatile memory element is controlled by a bidirectional current running through the first nonvolatile memory element, and
wherein an electrical potential of the intermediate voltage source is fixed and higher than that of the low voltage source but lower than that of the high voltage source.

19. The nonvolatile latch circuit of claim 17, further comprising a second nonvolatile memory element electrically coupled between an output terminal of the first logic gate and the intermediate voltage source.

20. The nonvolatile latch circuit of claim 18, wherein the nonvolatile memory element is a magntoresistive element, or a phase change memory element, or a resistive memory element.

* * * * *